US010856424B2

(12) United States Patent
Boyapati et al.

(10) Patent No.: US 10,856,424 B2
(45) Date of Patent: Dec. 1, 2020

(54) ELECTRONIC ASSEMBLY THAT INCLUDES VOID FREE HOLES

(71) Applicant: Intel Corporation, Santa Clara, CA (US)

(72) Inventors: Sri Ranga Sai Boyapati, Chandler, AZ (US); Amanda E. Schuckman, Chandler, AZ (US); Sashi S. Kandanur, Chandler, AZ (US); Srinivas Pietambaram, Gilbert, AZ (US); Mark Hlad, Chandler, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 299 days.

(21) Appl. No.: 15/762,856

(22) PCT Filed: Sep. 25, 2015

(86) PCT No.: PCT/US2015/052446

§ 371 (c)(1),
(2) Date: Mar. 23, 2018

(87) PCT Pub. No.: WO2017/052642

PCT Pub. Date: Mar. 30, 2017

(65) Prior Publication Data

US 2018/0288885 A1 Oct. 4, 2018

(51) Int. Cl.

*C25D 3/38* (2006.01)
*H05K 3/42* (2006.01)
*H05K 3/46* (2006.01)

(52) U.S. Cl.

CPC ............... *H05K 3/424* (2013.01); *C25D 3/38* (2013.01); *H05K 3/427* (2013.01); *H05K 3/429* (2013.01); *H05K 3/4602* (2013.01)

(58) Field of Classification Search

None

See application file for complete search history.

(56) References Cited

U.S. PATENT DOCUMENTS

| | | | | |
|---|---|---|---|---|
| 5,891,606 A * | 4/1999 | Brown | H05K 1/115 216/18 |
| 7,875,809 B2 * | 1/2011 | Chang | H05K 3/4602 174/254 |

(Continued)

FOREIGN PATENT DOCUMENTS

| | | |
|---|---|---|
| CN | 108369932 | 8/2018 |
| WO | WO-2017052642 A1 | 3/2017 |

OTHER PUBLICATIONS

"International Application Serial No. PCT/US2015/052446, International Search Report dated May 31, 2016", 4 pgs.

(Continued)

*Primary Examiner* — Stefanie S Wittenberg

(74) *Attorney, Agent, or Firm* — Schwegman Lundberg & Woessner, P.A.

(57) ABSTRACT

A method that includes electroplating both sides of a core and the through hole of a core with a conductive material to cover both sides of the core with the conductive material and to form a conductive bridge in the through hole, wherein the core has a thickness greater than 200 microns; etching the conductive material that covers both sides of the core to reduce the thickness of the conductive material to about 1 micron; applying a film resist to the core; exposing and developing the resist film to form patterns on the conductive material on both sides of the core; and electroplating additional conductive material on the (i) conductive material on both sides of the core (ii) conductive material within the through hole; and (iii) conductive bridge to fill the through (Continued)

26 22 26 21 29 29 23 24A 22 24B 21 29 29 23 24A 24B hole with conductive material without any voids and to form conductive patterns on both sides of the core.

8 Claims, 8 Drawing Sheets

(56) References Cited

U.S. PATENT DOCUMENTS

| | | | | |
|---|---|---|---|---|
| 2002/0139389 | A1 | 10/2002 | Treur | |
| 2004/0163682 | A1 | 8/2004 | Boyd et al. | |
| 2006/0021794 | A1* | 2/2006 | Cheng | H05K 3/0032 174/264 |
| 2007/0277373 | A1 | 12/2007 | Takai et al. | |
| 2008/0041615 | A1 | 2/2008 | Zhong et al. | |
| 2008/0302468 | A1* | 12/2008 | Sidhu | H05K 1/116 156/150 |
| 2010/0163297 | A1* | 7/2010 | Kajihara | H05K 3/427 174/264 |
| 2011/0099807 | A1 | 5/2011 | Kim et al. | |
| 2011/0120762 | A1* | 5/2011 | Kawai | H05K 3/423 174/264 |
| 2014/0042032 | A1* | 2/2014 | Shimoyama | C25D 21/10 205/118 |
| 2014/0138252 | A1* | 5/2014 | Dambrowsky | C25D 3/38 205/131 |
| 2015/0156888 | A1* | 6/2015 | Kawai | H05K 3/423 205/125 |
| 2018/0010258 | A1* | 1/2018 | Fujiwara | C25D 5/18 |

OTHER PUBLICATIONS

"International Application Serial No. PCT/US2015/052446, Written Opinion dated May 31, 2016", 7 pgs.

* cited by examiner

| PROCESS FLOW | PRIOR ART | EXAMPLE METHOD |
|---|---|---|
| 1 | CORE WITH Cu FOIL | CORE WITH Cu FOIL |
| 2 | Cu FOIL THICKNESS REDUCTION BY ETCHING | Cu FOIL THICKNESS REDUCTION BY ETCHING |
| 3 | BO ROUGHENING | BO ROUGHENING |
| 4 | LASER TH DRILL | LASER TH DRILL |
| 5 | DESMEAR, E-LESS Cu | DESMEAR, E-LESS Cu |
| 6 | E-LYTIC Cu FILLING | DFR LAMINATION, EXPOSURE, DEVELOPING |
| 7 | DFR LAMINATION, EXPOSURE, DEVELOPING | E-LYTIC Cu FILLING |
| 8 | Cu SUBTRACTIVE ETCH | DFR STRIP |
| 9 | DFR STRIP | FLASH ETCH |

*FIG. 3*

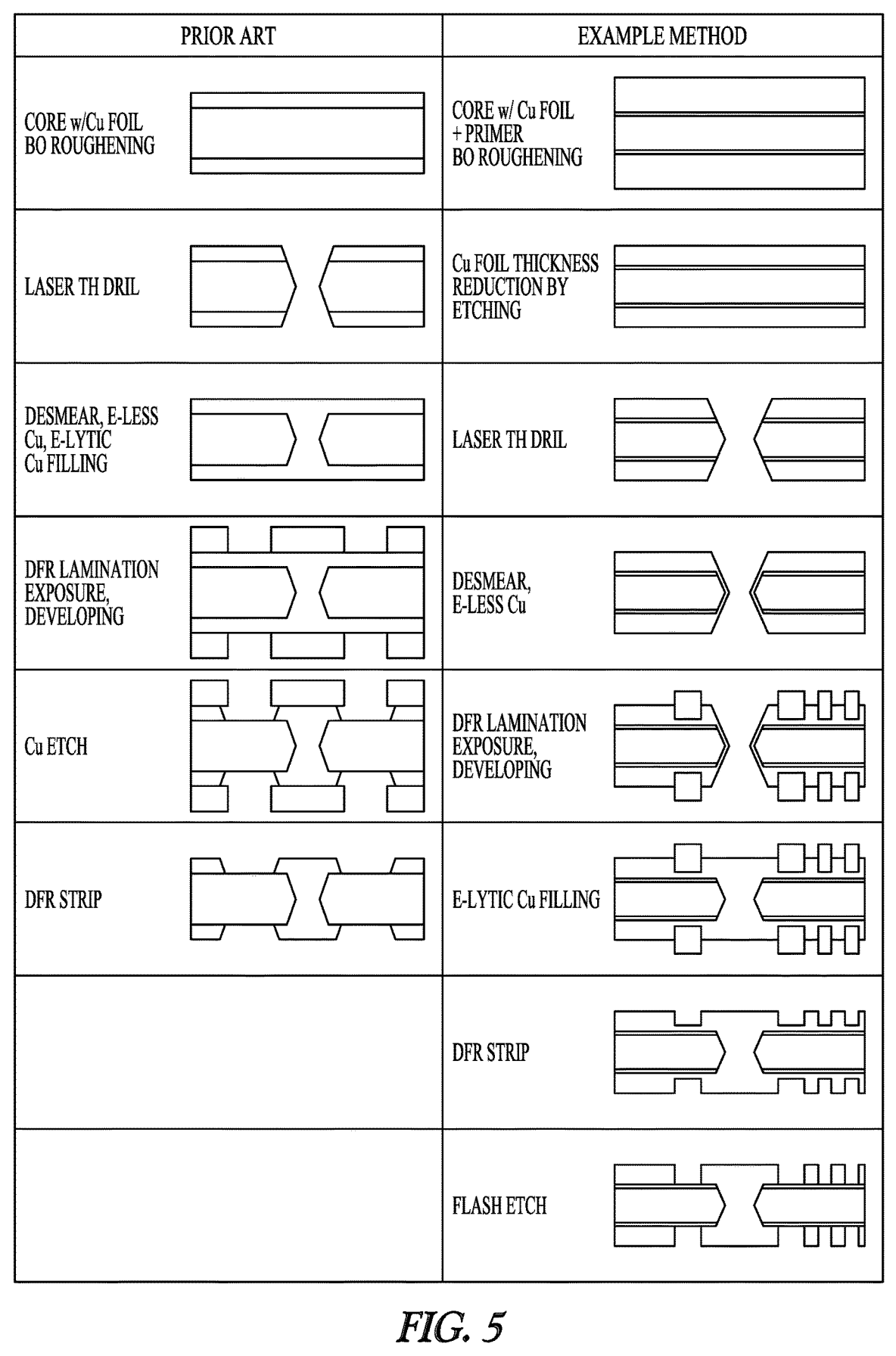

| PRIOR ART | EXAMPLE METHOD |
| --- | --- |
| CORE w/Cu FOIL BO ROUGHENING | CORE w/ Cu FOIL + PRIMER BO ROUGHENING |
| LASER TH DRIL | Cu FOIL THICKNESS REDUCTION BY ETCHING |
| DESMEAR, E-LESS Cu, E-LYTIC Cu FILLING | LASER TH DRIL |
| DFR LAMINATION EXPOSURE, DEVELOPING | DESMEAR, E-LESS Cu |
| Cu ETCH | DFR LAMINATION EXPOSURE, DEVELOPING |
| DFR STRIP | E-LYTIC Cu FILLING |
| | DFR STRIP |
| | FLASH ETCH |

FIG. 5

ELECTRONIC ASSEMBLY THAT INCLUDES VOID FREE HOLES

CROSS-REFERENCE TO RELATED APPLICATION

This application is a U.S. National Stage Filing under 35 U.S.C. 371 from International Application No. PCT/US2015/052446, filed on Sep. 25, 2015, and published as WO 2017/052642, which application is incorporated herein by reference in its entirety.

BACKGROUND

There are two conventional approaches for forming copper patterns on core layers. A typical copper pattern includes copper traces on both sides of the core and copper filled through hole vias that extend thorough the core.

One known patterning technique involves covering both sides of the core with electrolytic copper and also filling a laser drilled through hole in the core with the electrolytic copper. Both sides of the core are then subtractive patterned and etched in order to form conductive traces on both sides of the core.

One of the drawbacks with this known technique is that the finest line-spacing that may be achieved with subtractive patterning of the electrolytic copper is 50/50 for 25 um copper traces. These line-spacing limitations inhibit the ability to make smaller and faster electronic devices.

Another known technique involves patterning a core layer using a modified Semi-additive Process (mSAP). The mSAP fills the through holes in a core through a pattern electroplating process. Using a pattern electroplating process can achieve finer line-spacing on a core (e.g., <20/20 on a 25 um copper trace).

One of the drawbacks when using this conventional mSAP is that there is typically undesirably large voids in the through hole after the pattern electroplating process. These undesirably large voids within the through hole in the core may cause the core to have reliability failures due to unwanted migration of the voids

BRIEF DESCRIPTION OF THE DRAWINGS

FIG. 3 is a process flow table that compares a prior art electronic assembly fabrication method with an example electronic assembly fabrication method.

FIG. 5 is a process flow table that compares a prior art electronic assembly fabrication method with another example electronic assembly fabrication method.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies and method may overcome the drawbacks that are associated with the prior art electronic assemblies and methods. The electronic assemblies and methods described herein produce void-free vias.

The horizontal tools that are used in conventional processes typically utilize rollers that damage dry film resists on panels. The example electronic assemblies and methods described herein may be readily used with vertical plating systems such that the electronic assemblies that are produced generate void-free vias.

The electronic assemblies and methods described herein may also be more conducive to reducing core line spacing for present and future electronic assemblies. In addition, the electronic assemblies and methods will not damage and scratch dry film resist because the electronic assemblies and methods are readily used with vertically configured electroplating equipment.

Figure 1:
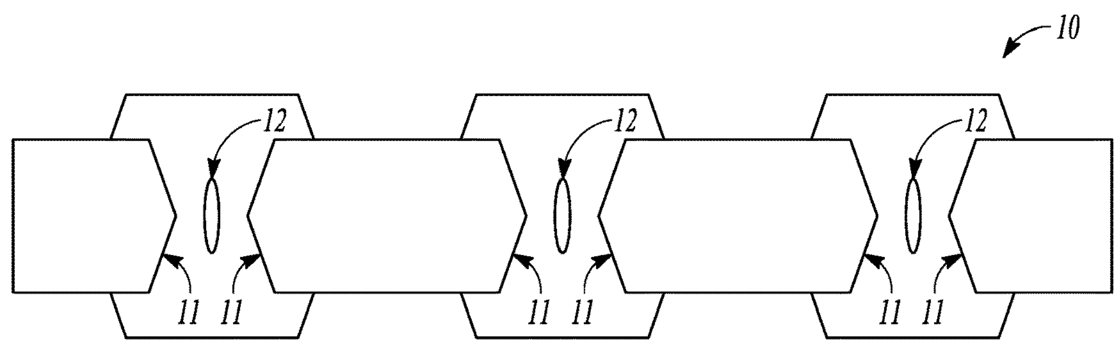
FIG. 1 is a schematic side view illustrating a prior art electronic assembly that includes through holes with voids.
Figure 2:
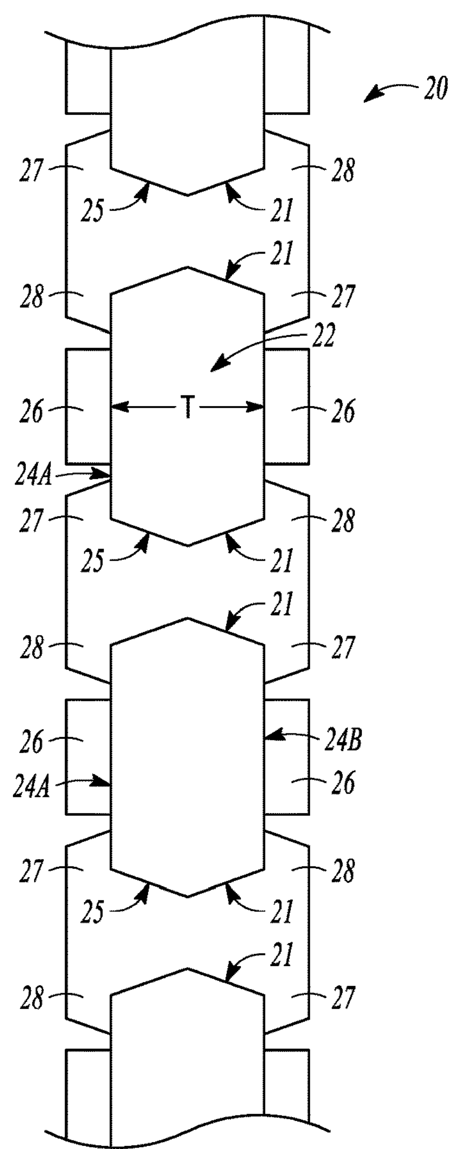
FIG. 2 is a schematic side view illustrating an example electronic assembly that includes through holes without voids.

FIG. 2 is a schematic side view illustrating an example electronic assembly 20 that includes through holes 21 without voids. The electronic assembly 20 includes a core 22 that includes a through hole 21. The core 22 has a thickness T greater than 200 microns.

The electronic assembly 20 further includes a conductive electrolysis seed layer (not shown in FIG. 2). The conductive electrolysis seed layer covers both sides 24A, 24B of the core 22 and side walls 25 of the through hole 21.

The electronic assembly 20 further includes a dry film resist 26. The dry film resist 26 covers portions of both sides 24A, 24B of the conductive electrolysis seed layer.

The electronic assembly 20 further includes a conductive electroplated layer 27 that fills the through hole 21. The conductive electroplated layer 27 also forms a conductive pattern 28 on both sides 24A, 24B of the core 22 without having voids in the through hole 21.

The line spacing of the conductive pattern 28 on both sides 24A, 24B of the core 22 may be reduced as compared to conventional electronic assemblies. Reducing the core 22 line spacing may allow for a reduction in the layer count of electronic packages (and therefore the overall cost of electronic packages). In addition, the electronic assembly 20 may allow for more flexibility in designing electronic packages.

In some forms, the conductive pattern 28 on the core 21 may include conductive traces that have a line spacing less than 25 microns. In addition, the line thickness of the conductive traces 28 may be greater than 25 microns.

In some forms, the conductive electrolysis seed layer may be copper. As an example, the conductive electrolysis seed layer may be about one micron in thickness. It should be noted that other materials besides copper are contemplated for the electrolysis seed layer. The type of material that is used for the conductive electrolysis seed layer will depend in part on the manufacturing processes and application when the electronic assembly 20 is to be utilized.

In some forms, the conductive electroplated layer 27 may be copper. As an example, the conductive electroplated layer 27 may be about 25 microns in thickness on both sides 24A, 24B of the core 21. It should be noted that other materials besides copper are contemplated for the conductive electroplated layer 27. It should be noted that manufacturers of electronic assemblies are able to distinguish electroless copper from electroplated copper using appropriate characterization equipment.

Figure 8:
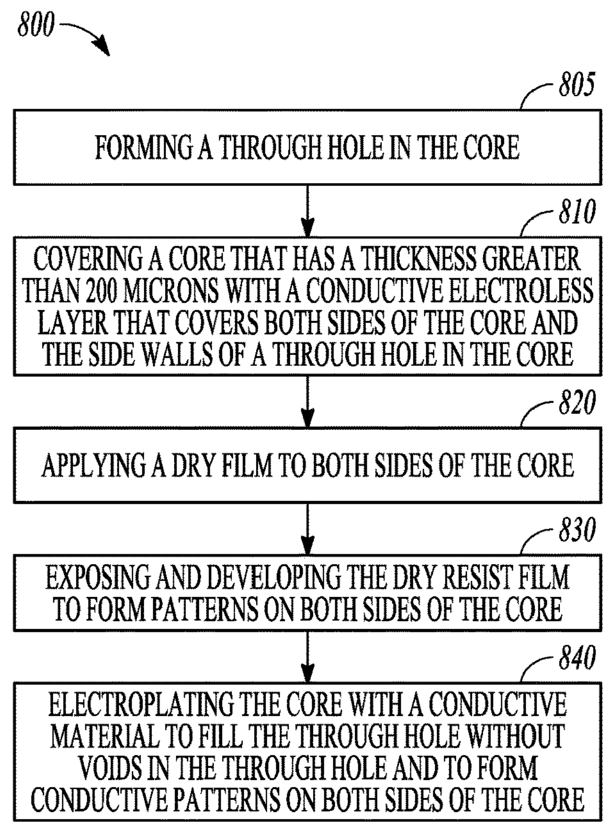
FIG. 8 is a flow diagram illustrating an example method of fabricating an electronic assembly that includes void free through holes.

FIG. 8 is a flow diagram illustrating an example method [800] of fabricating an electronic assembly 20 that includes void-free through holes 21. FIG. 3 is a process flow table that compares a prior art electronic assembly fabrication with an example electronic assembly fabrication method [800]. 4A-4C show schematic side views of an example electronic assembly 20 at various stages of process flow for the example method [800] shown in FIG. 3.

Figure 4C:
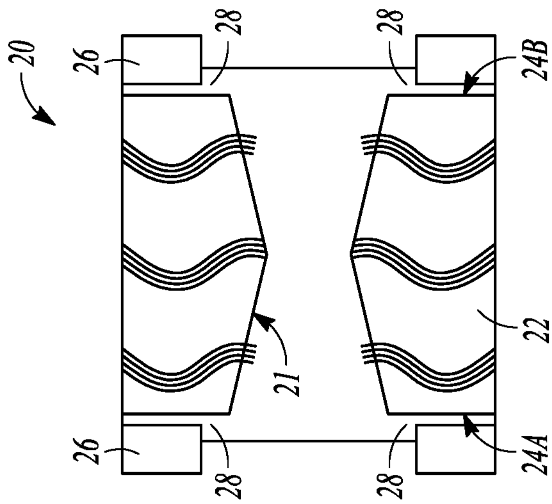
FIGS. 4A-4C show schematic side views of an example electronic assembly at various stages of process flow for the example method shown in FIG. 3.
Figure 4B:
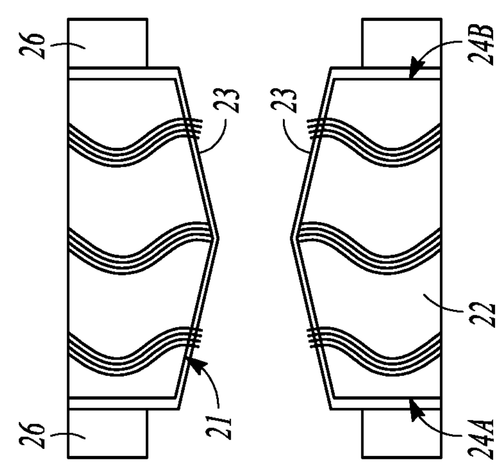
Figure 4A:
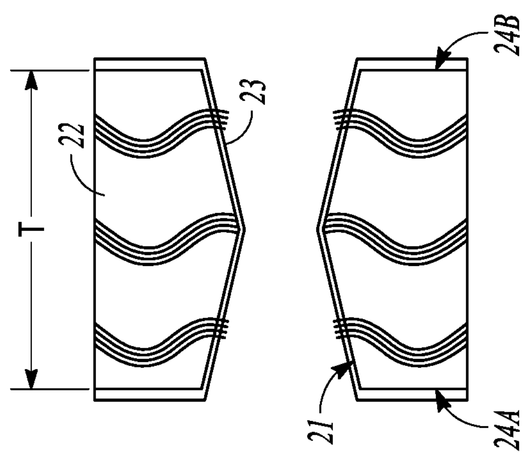

The method [800] includes [810] covering a core 22 that has a thickness T greater than 200 microns with a conductive electroless layer 23 (see FIG. 4A) that covers both sides 24A, 24B of the core 22 and the side walls 25 of a through hole 21 in the core 22.

The method [800] further includes [820] applying a dry resist film 26 (see FIG. 4B) to both sides 24A, 24B of the core 22 and [830] exposing and developing the dry resist film 26 to form patterns on both sides 24A, 24B of the core 21. The method [800] further includes electroplating [840] the core 22 with a conductive material 27 to fill the through hole 21 without voids in the through hole 21 and form conductive patterns 28 (see FIG. 4C) on both sides 24A, 24B of the core 22.

In some forms, [840] electroplating the core 22 with a conductive material includes electroplating the core 22 with copper. As an example, electroplating the core 22 may include electroplating both sides 24A, 24B of the core 22 to form conductive traces 28 that have a line spacing less than 25 microns with a line thickness greater than 25 microns. It should be noted that [840] electroplating the core 22 with a conductive material may include orienting the core 22 such that the core 22 is vertical and a longitudinal axis of the through hole 21 is horizontal (as shown in FIG. 2).

In some forms, [810] covering the core with electroless copper 23 may include covering the core 22 with about one micron of electroless copper 23. It should be noted that other materials besides copper may be used to cover the core 22.

The method [800] may further include [805] forming the through hole 21 and the core 22. As an example, [805] forming the through hole 21 and the core 22 may include laser drilling the through hole 21. Other example processes for forming the through hole include, but are not limited to, mechanically drilling (among other techniques).

Figure 6C:
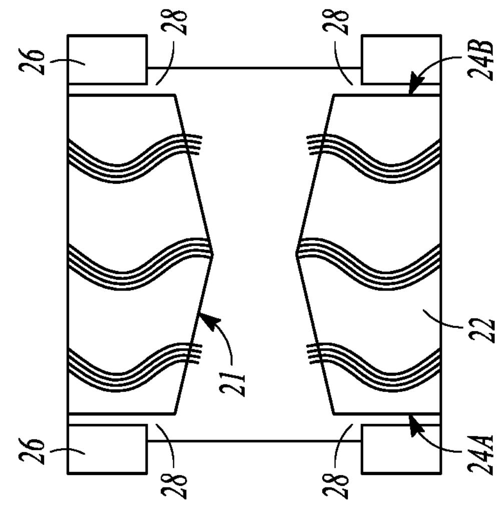
FIGS. 6A-6C show schematic side views of an example electronic assembly at various stages of process flow for the example method shown in FIG. 5.
Figure 6B:
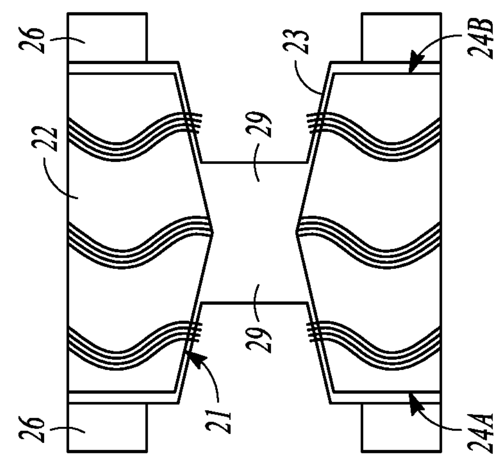
Figure 6A:
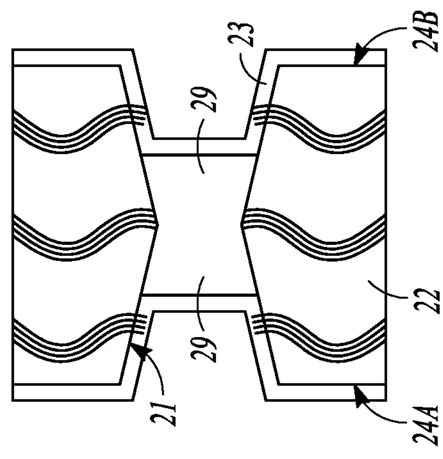
Figure 9:
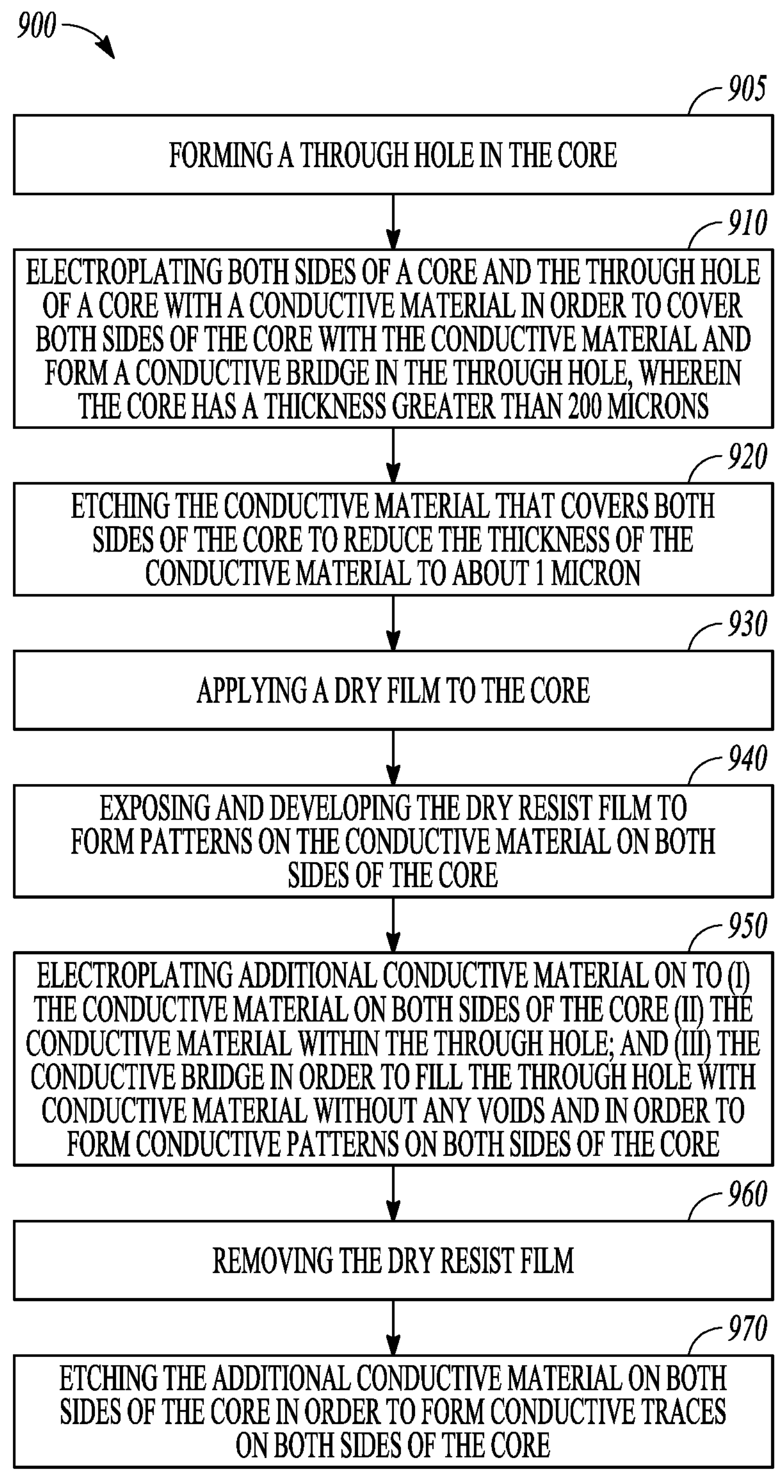
FIG. 9 is a flow diagram illustrating another example method of fabricating an electronic assembly that includes void free through holes.

FIG. 9 is a flow diagram illustrating another example method [900] of fabricating an electronic assembly 20 that includes void-free through holes 21. FIG. 5 is a process flow table that compares a prior art electronic assembly fabrication method with another example electronic assembly fabrication method [900]. FIGS. 6A-6C show schematic side views of the example electronic assembly 20 at various stages of process flow for the example method [900] shown in FIGS. 5 and 9.

As shown in FIG. 6A, the method [900] includes [910] electroplating both sides 24A, 24B of a core 22 and the through hole 21 of a core 22 with a conductive material (see, e.g., electroless 23) in order to cover both sides 24A, 24B of the core 22 with a conductive material. The conductive material forms a conductive bridge 29 in the through hole 21. The core 22 has a thickness T greater than 200 microns.

The method further includes [920] etching the conductive material that covers both sides 24A, 24B of the core 22 to reduce the thickness of the conductive material to about one micron and [930] applying a dry film 26 to the core 22. The method [900] further includes [940] exposing and developing the dry film 26 to form patterns on the conductive material on both sides 24A, 24B of the core 22 (see FIG. 6B).

The method [900] further includes [950] electroplating additional conductive material on to the conductive material on both sides 24A, 24B of the core 22 and the conductive material within the through hole 21 (see FIG. 6C). Additional conductive material is also electroplated on to the conductive bridge 29 in order to fill the through hole 21 with conductive material without any voids and in order to form conductive patterns 28 on both sides 24A, 24B of the core 22.

In some forms, [950] electroplating both sides 24A, 24B of a core 22 and the through hole 21 of a core 22 with a conductive material may include electroplating both sides 24A, 24B of the core 22 and the through hole 21 with copper. It should be noted that other material besides copper are contemplated for electroplating both sides 24A, 24B of the core 22 and the through hole 21 of the core 22.

It should be noted that [940] exposing and developing the dry resist film 26 to form patterns on the conductive material on both sides 24A, 24B of the core 22 may include forming patterns that have a line spacing less than 25 microns with a line thickness greater than 25 microns. The line spacing and line thickness of the patterns will depend in part on the type of dry resist film 26 and the type of conductive material.

The method [900] may further include [905] forming the through hole 21 and the core 22. As an example, [905] forming the through hole 21 and the core 22 may include laser drilling the through hole 21.

The method may further include [960] removing the dry resist film 26 (not shown in FIGS. 6A-6C). and [970] etching the additional conductive material on both sides 24A, 24B of the core 22 in order to further form conductive traces 28 on both sides 24A, 24B of the core 22 (not shown in FIGS. 6A-6C).

In some forms, [950] electroplating additional conductive material on to (i) the conductive patterns 28 on both sides 24A, 24B of the core 22; (ii) the conductive material within the through hole 21; and (iii) the bridge 29 may include orienting the core 22 such that the core 22 is vertical and a longitudinal axis of the through hole 21 is horizontal (see FIG. 2).

Orienting the core 22 in a vertical manner permits void-free filling of the through hole 21. In addition, the methods [800], [900] may provide protection of the core 22 edges against blisters which typically occurs with prior art methods.

Figure 7:
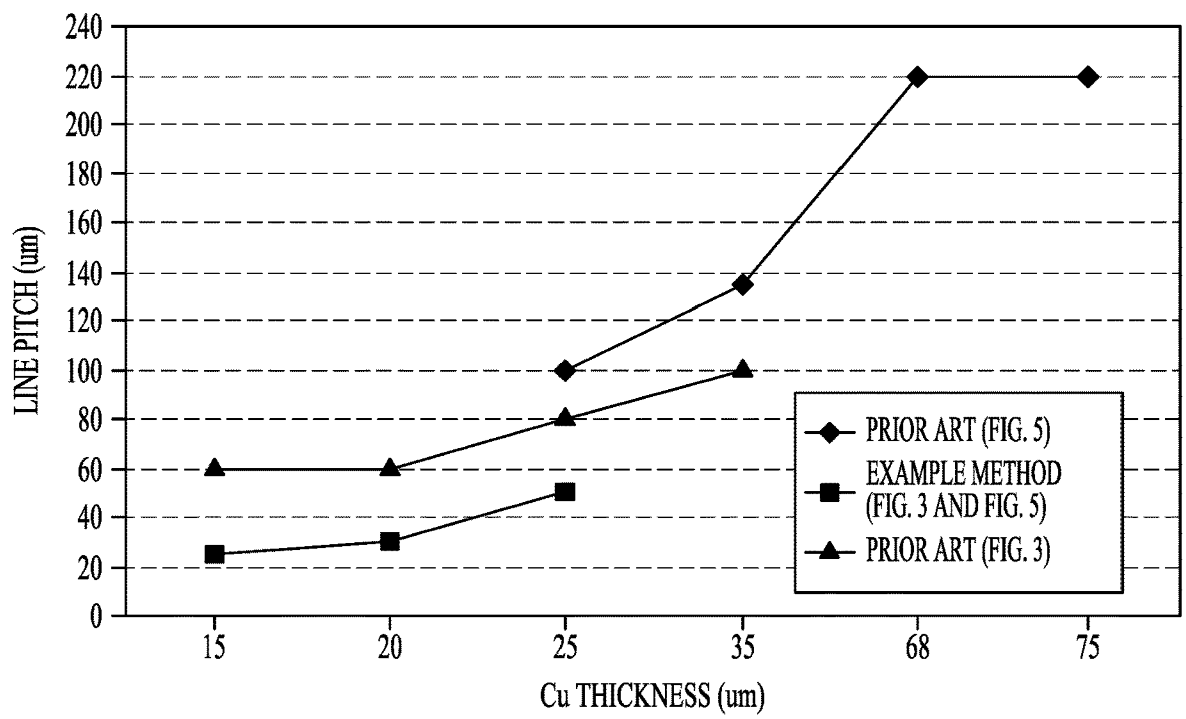
FIG. 7 is a table comparing the line spacing capability of electronic assemblies that are manufactured according to the prior art fabrication methods and the example fabrication methods shown in FIGS. 3 and 5.

The electronic assembly 20 and methods [800], [900] described herein provide void-free through hole filling. FIG. 7 is a table comparing the line spacing capability of electronic assemblies that are manufactured according to prior art fabrication methods and the example fabrication methods [800], [900] shown in FIGS. 3-6 and 8-9. The ability to fabricate void-free through holes may increase the reliability of electronic packages as well as provide design flexibility and potential cost reduction (e. g, by reducing layers in an electronic package).

Figure 10:
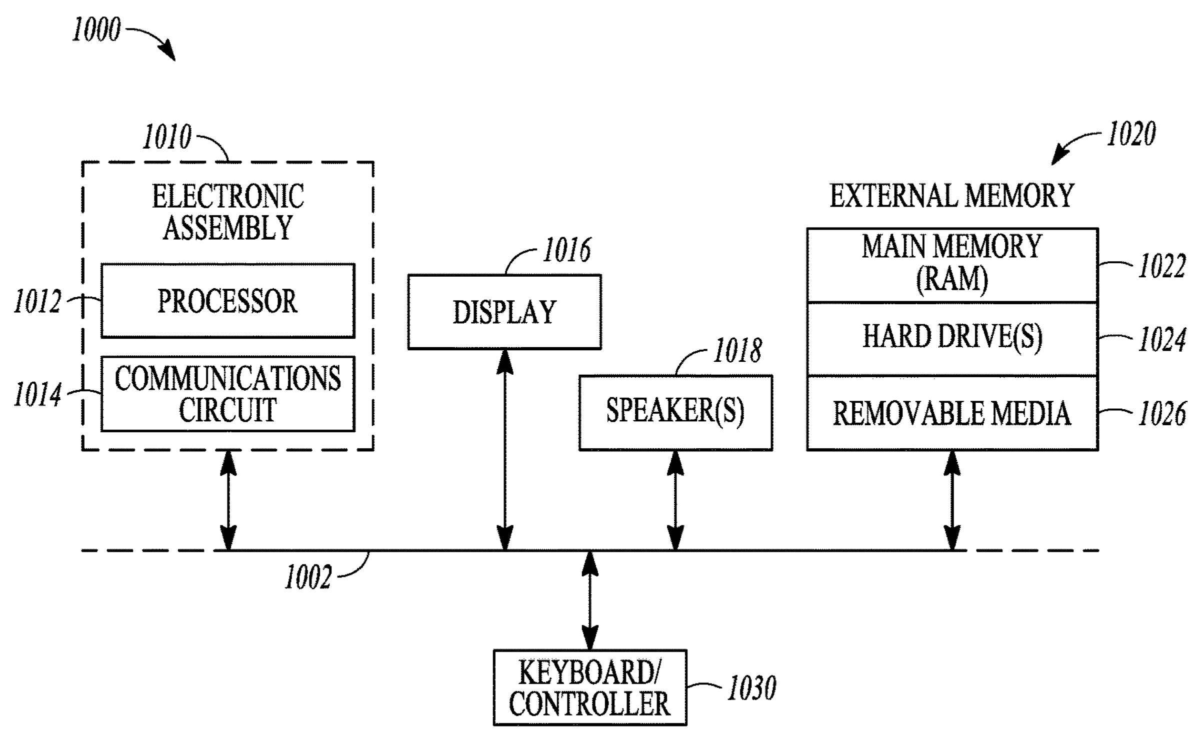
FIG. 10 is block diagram of an electronic apparatus that includes the electronic assemblies and/or methods described herein.

FIG. 10 is a block diagram of an electronic apparatus 1000 incorporating at least one of the electronic assemblies and/or methods described herein. Electronic apparatus 1000 is merely one example of an electronic apparatus in which forms of the electronic assemblies and/or methods described herein may be used. Examples of an electronic apparatus 1000 include, but are not limited to, personal computers, tablet computers, mobile telephones, game devices, MP3 or other digital media players, etc.

In this example, electronic apparatus 1000 comprises a data processing system that includes a system bus 1002 to couple the various components of the electronic apparatus 1000. System bus 1002 provides communications links among the various components of the electronic apparatus 1000 and may be implemented as a single bus, as a combination of busses, or in any other suitable manner.

An electronic apparatus 1000 as describe herein may be coupled to system bus 1002. The electronic apparatus 1000 may include any circuit or combination of circuits. In one embodiment, the electronic apparatus 1000 includes a processor 1012 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1000 are a custom circuit, an application-specific integrated circuit (ASIC), or the like, such as, for example, one or more circuits (such as a communications circuit 1014) for use in wireless devices like mobile telephones, tablet computers, laptop computers, two-way radios, and similar electronic systems. The IC can perform any other type of function.

The electronic apparatus 1000 may also include an external memory 1020, which in turn may include one or more memory elements suitable to the particular application, such as a main memory 1022 in the form of random access memory (RAM), one or more hard drives 1024, and/or one or more drives that handle removable media 1026 such as compact disks (CD), flash memory cards, digital video disk (DVD), and the like.

The electronic apparatus 1000 may also include a display device 1016, one or more speakers 1018, and a keyboard and/or controller 1030, which can include a mouse, trackball, touch pad, voice-recognition device, or any other device that permits a system user to input information into and receive information from the electronic apparatus 1000.

To better illustrate the electronic assemblies and/or methods disclosed herein, a non-limiting list of examples is provided herein:

Example 1 includes an electronic assembly having a core that includes a through hole, wherein the core has a thickness greater than 200 microns; a conductive electroless seed layer covering both sides of the core and side walls of the through hole; a dry film resist covering portions of both sides of the conductive electroless seedless layer; and a conductive electroplated layer that fills the through hole and forms a conductive pattern on both sides of the core without having voids in the through hole.

Example 2 includes the electronic assembly of example 1, wherein the conductive pattern includes conductive traces that have a line spacing less than 25 microns with a line thickness greater than 25 microns.

Example 3 includes the electronic assembly of any one of examples 1-2, wherein the conductive electroless seed layer is copper.

Example 4 includes the electronic assembly of any one of examples 1-3, wherein the conductive electroless seed layer is about 1 micron in thickness.

Example 5 includes the electronic assembly of any one of examples 1-4, wherein the conductive electroplated layer is copper.

Example 6 includes the electronic assembly of any one of examples 1-5, wherein the conductive electroplated layer is about 25 microns in thickness on both sides of the core.

Example 7 is a method that includes covering a core that has a thickness greater than 200 microns with a conductive electroless layer that covers both sides of the core and the side walls of a through hole in the core; applying a dry film resist to both sides of the core; exposing and developing the dry resist film to form patterns on both sides of the core; and electroplating the core with a conductive material to fill the through hole without voids in the through hole and to form conductive patterns on both sides of the core.

Example 8 includes the method of example 7, wherein electroplating the core with a conductive material includes electroplating the core with copper.

Example 9 includes the method of any one of examples 7-8, wherein electroplating the core includes electroplating both sides of the core to form conductive traces that have a line spacing less than 25 microns with a line thickness greater than 25 microns.

Example 10 includes the method of any one of examples 7-9, wherein covering the core with the conductive electroless layer includes covering the core with copper.

Example 11 includes the method of any one of examples 7-10, wherein covering the core with electroless copper includes covering the core with about 1 micron of electroless copper.

Example 12 includes the electronic assembly of any of examples 7-11, wherein electroplating the core with a conductive material includes orienting the core such that the core is vertical and a longitudinal axis of the through hole is horizontal.

Example 13 is a method that includes electroplating both sides of a core and the through hole of a core with a conductive material in order to cover both sides of the core with the conductive material and to form a conductive bridge in the through hole, wherein the core has a thickness greater than 200 microns; etching the conductive material that covers both sides of the core to reduce the thickness of the conductive material to about 1 micron; applying a dry film resist to the core; exposing and developing the dry resist film to form patterns on the conductive material on both sides of the core; and electroplating additional conductive material on to (i) the conductive material on both sides of the core (ii) the conductive material within the through hole; and (iii) the conductive bridge in order to fill the through hole with conductive material without any voids and to form conductive patterns on both sides of the core.

Example 14 includes the method of example 13, wherein electroplating both sides of a core and the through hole of a core with a conductive material in order to cover both sides of the core with the conductive material and to form a conductive bridge in the through hole in the core includes electroplating both sides of the core and the through hole of the core with copper.

Example 15 includes the method of any one of examples 13-14, wherein exposing and developing the dry resist film to form patterns on the conductive material on both sides of the core includes forming patterns that have a line spacing less than 25 microns with a line thickness greater than 25 microns.

Example 16 includes the method of any one of examples 13-15, and further including forming the through hole in the core.

Example 17 includes the method of any one of examples 13-16, wherein forming the through hole in the core includes laser drilling the through hole.

Example 18 includes the method of any one of examples 13-17, and further including removing the dry resist film.

Example 19 includes the method of any one of examples 13-18, and further including etching the additional conductive material on both sides of the core in order to form conductive traces on both sides of the core.

Example 20 includes the method of any one of examples 13-19, wherein electroplating additional conductive material on to (i) the conductive patterns on both sides of the core (ii) the conductive material within the through hole; and (iii) the bridge includes orienting the core such that the core is vertical and a longitudinal axis of the through hole is horizontal.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:

electroplating both sides of a core and a through hole of a core with a conductive material in order to cover both sides of the core with the conductive material and to form a conductive bridge in the through hole, wherein the core has a thickness greater than 200 microns;

etching the conductive material that covers both sides of the core to reduce the thickness of the conductive material to about 1 micron;

applying a dry film resist to the core;

exposing and developing the dry resist film to form patterns on the conductive material on both sides of the core; and electroplating additional conductive material on to (i) the conductive material on both sides of the core (ii) the conductive material within the through hole; and (iii) the conductive bridge in order to fill the through hole with conductive material without any voids and to form conductive patterns on both sides of the core.

2. The method of claim 1, wherein electroplating both sides of a core and the through hole of a core with a conductive material in order to cover both sides of the core with the conductive material and to form a conductive bridge in the through hole in the core includes electroplating both sides of the core and the through hole of the core with copper.

3. The method of claim 1, wherein exposing and developing the dry resist film to form patterns on the conductive material on both sides of the core includes forming patterns that have a line spacing less than 25 microns with a line thickness greater than 25 microns.

4. The method of claim 1, further comprising forming the through hole in the core.

5. The method of claim 4, wherein forming the through hole in the core includes laser drilling the through hole.

6. The method of claim 1, further comprising removing the dry resist film.

7. The method of claim 1, further comprising etching the additional conductive material on both sides of the core in order to form conductive traces on both sides of the core.

8. The method of claim 1, wherein electroplating additional conductive material on to (i) the conductive patterns on both sides of the core (ii) the conductive material within the through hole; and (iii) the conductive bridge includes orienting the core such that the core is vertical and a longitudinal axis of the through hole is horizontal.

* * * * *